United States Patent
Chuang et al.

(10) Patent No.: US 10,509,071 B2
(45) Date of Patent: Dec. 17, 2019

(54) METHOD AND SYSTEM FOR ALIGNING PROBE CARD IN SEMICONDUCTOR DEVICE TESTING

(71) Applicant: Taiwan Semiconductor Manufacturing Co., Ltd., Hsinchu (TW)

(72) Inventors: Kai-Di Chuang, Taipei (TW); Tien-Chung Lee, Zhubei (TW); Chiu-Hua Chung, Hsinchu (TW); Kang-Tai Peng, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 363 days.

(21) Appl. No.: 15/355,446

(22) Filed: Nov. 18, 2016

(65) Prior Publication Data
US 2018/0143244 A1    May 24, 2018

(51) Int. Cl.
*G01R 31/28* (2006.01)
*G01R 1/073* (2006.01)

(52) U.S. Cl.
CPC ...... *G01R 31/2891* (2013.01); *G01R 1/07342* (2013.01)

(58) Field of Classification Search
CPC ..... G03F 9/7073; H01L 21/68; H01L 21/681; H01L 27/146
USPC ............ 324/750.16, 750.23, 754.01, 754.03, 324/754.07, 755.01, 755.11, 756.03, 758
See application file for complete search history.

(56) References Cited

U.S. PATENT DOCUMENTS

| | | | | |
|---|---|---|---|---|
| 5,493,236 A * | 2/1996 | Ishii | ............ | G01R 31/2656 324/501 |
| 5,644,245 A * | 7/1997 | Saitoh | ............ | G01R 1/06794 324/750.18 |
| 5,982,132 A * | 11/1999 | Colby | ............ | H01L 21/68 269/71 |
| 6,002,426 A * | 12/1999 | Back | ............ | H04N 7/181 348/87 |
| 6,208,375 B1 * | 3/2001 | Kay | ............ | G01R 1/06705 348/95 |
| 6,208,419 B1 * | 3/2001 | Yamamoto | ........ | H01L 21/67144 356/400 |

(Continued)

FOREIGN PATENT DOCUMENTS

| | | | |
|---|---|---|---|
| CN | 101762862 A | * | 6/2010 |
| CN | 201628540 U | * | 11/2010 |
| KR | 20080041792 A | * | 5/2008 |

OTHER PUBLICATIONS

English Translation of CN-101762862-A via espacenet (Year: 2019).*

*Primary Examiner* — Patrick Assouad
*Assistant Examiner* — Sean Curtis
(74) *Attorney, Agent, or Firm* — McClure, Qualey & Rodack, LLP

(57) ABSTRACT

A method for probe card alignment is provided. The method includes providing a probe card with a plurality of probe needles having their distal ends on a reference plane. The method further includes providing a light from both the upper side and lower side of the reference plane. The method also includes using a camera to image the probe needles. In addition, the method includes performing a probe card alignment process according to the image generated by the camera.

20 Claims, 7 Drawing Sheets

(56) References Cited

U.S. PATENT DOCUMENTS

| | | | |
|---|---|---|---|
| 6,246,245 B1* | 6/2001 | Akram | G01R 1/07378 324/756.03 |
| 6,256,882 B1* | 7/2001 | Gleason | G01R 1/0735 29/426.1 |
| 6,429,671 B1* | 8/2002 | Duckworth | G01R 1/07378 324/750.23 |
| 6,515,494 B1* | 2/2003 | Low | G01N 21/9501 324/501 |
| 6,864,697 B1* | 3/2005 | Lin | G01R 31/2887 324/750.25 |
| 7,538,564 B2* | 5/2009 | Ehrmann | G01R 31/2891 324/754.03 |
| 7,750,651 B2* | 7/2010 | Chao | G01R 1/0735 324/756.03 |
| 7,772,862 B2* | 8/2010 | Yamada | G01R 31/2891 324/754.01 |
| 8,130,004 B2* | 3/2012 | Yamada | G01R 31/2891 324/750.16 |
| 8,248,097 B2* | 8/2012 | Ippolito | G01R 31/311 324/756.03 |
| 8,405,442 B2 | 3/2013 | Chen | |
| 8,416,426 B2* | 4/2013 | Yamagata | G01B 11/03 356/601 |
| 8,436,671 B2 | 5/2013 | Chern et al. | |
| 8,476,918 B2* | 7/2013 | Huang | G01R 31/2635 324/754.01 |
| 8,493,083 B2* | 7/2013 | Kiyokawa | G01R 31/2891 324/750.16 |
| 8,610,488 B2 | 12/2013 | Yu et al. | |
| 8,625,240 B2 | 1/2014 | Chung et al. | |
| 8,832,933 B2* | 9/2014 | Kuo | G01R 1/0491 228/123.1 |
| 8,847,659 B1 | 9/2014 | Lan et al. | |
| 9,197,199 B2 | 11/2015 | Huang et al. | |
| 9,214,933 B2 | 12/2015 | Chern et al. | |
| 9,450,573 B2 | 9/2016 | Chern et al. | |
| 2005/0035311 A1* | 2/2005 | Asakawa | G01N 21/8806 250/559.16 |
| 2005/0167620 A1* | 8/2005 | Cho | G01N 21/95 250/559.45 |
| 2007/0096763 A1* | 5/2007 | Ehrmann | G01R 31/2891 324/750.23 |
| 2008/0094087 A1* | 4/2008 | Lee | G01R 31/2891 324/750.15 |
| 2008/0122469 A1* | 5/2008 | Lu | G01R 1/07342 324/756.03 |
| 2008/0284455 A1* | 11/2008 | Obikane | G01R 31/2893 324/754.08 |
| 2014/0015561 A1* | 1/2014 | Chang | G01R 1/07342 324/756.03 |
| 2015/0109625 A1* | 4/2015 | Ozawa | G01R 31/2891 356/601 |
| 2015/0219709 A1* | 8/2015 | Munoz | G01N 21/9501 356/244 |
| 2015/0234006 A1* | 8/2015 | Richards | G01R 31/308 324/756.02 |
| 2015/0276803 A1* | 10/2015 | Weimer | G01R 31/2621 324/762.09 |
| 2015/0362552 A1* | 12/2015 | Ozawa | G01R 31/2891 324/750.23 |
| 2016/0161553 A1* | 6/2016 | Tamura | G01R 31/2891 324/750.23 |
| 2016/0377657 A1* | 12/2016 | Schwartz | G01R 1/06794 324/750.23 |
| 2018/0143244 A1* | 5/2018 | Chuang | G01R 31/2891 |

\* cited by examiner

METHOD AND SYSTEM FOR ALIGNING PROBE CARD IN SEMICONDUCTOR DEVICE TESTING

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits. Dozens or hundreds of integrated circuits are typically manufactured on a single semiconductor wafer. The individual devices are singulated by sawing the integrated circuits along a scribe line. The individual devices are then packaged separately, in multi-chip modules, or in other types of packaging, for example.

The semiconductor devices are electrically tested before being installed within an electronic or other device by use of a test probe assembly which includes a probe card. In cases wherein the probe card is not aligned with a wafer stage for holding the semiconductor devices, the probe card may fail to make proper contact with a conductor pad on the semiconductor device, thus providing false or inaccurate test results, which in turn reduces production yield.

Therefore, it is desirable to provide a solution for aligning the probe card to prevent the aforementioned testing inaccuracies from occurring.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
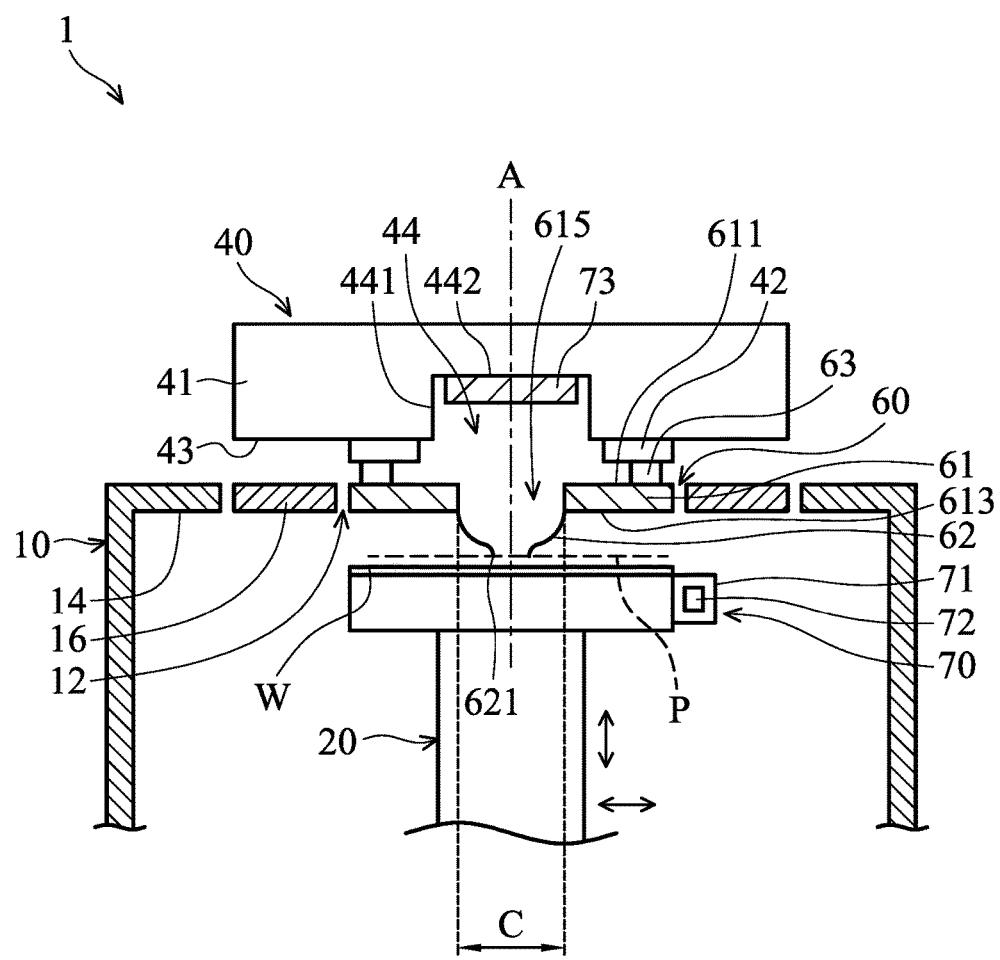
FIG. 1 shows a cross-sectional view of a testing system, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 shows a schematic diagram of one embodiment of a testing system 1 for testing a semiconductor wafer W in accordance with some embodiments. The semiconductor wafer W may be made of silicon or other semiconductor materials. The semiconductor wafer W may have various device elements. Examples of device elements that are formed in the wafer W include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

In some embodiments, the testing system 1 includes a testing chamber 10, a wafer stage 20, a test head 40, a probe card 60, and an alignment assembly 70. The elements of the alignment assembly 10 can be added to or omitted, and the invention should not be limited by the embodiment.

The testing chamber 10 is configured to accommodate a semiconductor wafer W which is going to undergo a wafer acceptance test (WAT). The testing chamber 10 has a hollow configuration with an open upper side wall 14. A holder 16 with an opening 12 is positioned on an upper side wall 14 for carrying the probe card 60. The opening 12 has a shape that is compatible with that of the probe card 60. For example, both the opening 12 and the probe card 60 are circular, and the diameter of the opening 12 is sufficiently greater than the probe card 60 to allowing the probe card 60 to pass through.

The wafer stage 20 is disposed in the testing chamber 10. In some embodiments, the wafer stage 20 is configured for holding, positioning, moving, and otherwise manipulating the semiconductor wafer W. The semiconductor wafer W may be secured on the wafer stage 20 using a clamping mechanism, such as vacuum clamping or e-chuck clamping. The wafer stage 20 is designed and configured to be operable for vertical, translational, and rotational motions.

The test head 40 is configured to electrically connect the processor (not shown in figures) to the probe card 60 that is positioned in the testing chamber 10. The test head 40 includes a cover 41, a number of electrodes 42 (only two electrodes 42 are shown in FIG. 1) formed on a bottom surface 43 of the cover 41 that face the testing chamber. The cover 41 may be construed so as to be movable relative to the testing chamber 10 by a hinge mechanism (not shown in figures).

In some embodiments, a recess 44 is formed on the bottom surface 43 of the cover 41. The electrodes 42 are arranged surrounding the edge of the recess 44. The recess 44 may have a side wall 441 and a top wall 442. The top wall 442 is connected to the bottom surface 43 via the side wall 441. The top wall 442 may be arranged parallel to the bottom surface 43 and perpendicular to the side wall 441. In some other embodiments, the recess 44 is omitted, and the bottom surface 43 is a planar surface.

The probe card 60 provides an interface to couple the semiconductor wafer W to the processor (not shown in figures) through the test head 40. In some embodiments, the probe card 60 includes a substrate 61, a number of probe needles 62, and a number of electrical contacts 63 (only two electrical contacts 63 are shown in FIG. 1).

In some embodiments, the substrate 61 is a printed circuit board (PCB) and has an upper surface 611 and a lower surface 613. A through hole 615 is formed at a predetermined region C of the substrate 61 and penetrates the upper surface 611 and the lower surface 613. The predetermined region C may be located at the center of the substrate 61. The electrical contacts 63 are arranged on the upper surface 611 and surrounds the through hole 615. The arrangements and the number of the electrical contacts 63 are corresponding to the arrangements and the number of the electrodes 42 of the test head 40.

The probe needles 62 are positioned on the substrate 61 and arranged around the through hole 615. The probe needles 62 are electrically connected to the electrical contacts 63 via conductive lines (not shown in figures) embedded in the substrate 61. The probe needles 62 project from the lower surface 613 of the substrate 61 and extend inwardly and downwardly. As a result, the distal ends 621 of the probe needles 62 are located at a reference plane P that is distant from and parallel to the substrate 61. In addition, in top view, the distal ends 621 of the probe needles 62 are located below the through hole 615.

The alignment assembly 70 is configured to align the probe card 60 relative to the wafer stage 20. In some embodiments, the alignment assembly 70 includes a camera 71, a light source 72 and a backlight unit 73.

The camera 71 is configured to image the probe needles 62 of the probe card 60 in probe card alignment process. In some embodiments, the camera 71 is positioned below the reference plane P and is moveable relative to the probe card 60 in a horizontal direction. For example, the camera 71 is positioned on an edge of the wafer stage 20 and moved together with the wafer stage 20. In some embodiments, the camera 71 is oriented upwardly, such that when the camera 71 is moved below the through hole 615 of the probe card 60, the bottom view of the probe needles 62 is imaged by the camera 71. The camera 71 may include a charge-coupled device (CCD).

The light source 72 is configured to illuminate the probe needles 62 of the probe card 60 from a lower side in probe card alignment process. In some embodiments, the light source 72 is positioned below the reference plane P and is moveable relative to the probe card 60 in a horizontal direction. For example, the light source 72 is positioned on an edge of the wafer stage 20 and moved together with the wafer stage 20. In some embodiments, the light source 72 is oriented upwardly to provide vertical light. As a result, when the light source 72 is moved below the through hole 615 of the probe card 60, the bottom the probe needles 62 is illuminated by the light source 72 and passes through the through hole 615

The light source 72 may be adapted to generate any type of light. The light source 72 may be construed integrated with the camera 71. Alternatively, the light source 72 may be construed separated from the camera 71 and positioned immediately adjacent to the camera 71.

The backlight unit 73 is configured to provide light to illuminate the probe needles 62 of the probe card 60 from an upper side in probe card alignment process. In some embodiments, the backlight unit 73 is positioned above the reference plane P and located above the probe card 60. For example, the backlight unit 73 is mounted in the recess 44 of the test head 40.

In some embodiments, the backlight unit 73 is a light-reflective element. The light-reflective element 73, for example, is a thin plastic film, such as acrylic sheet or roll film, a metal foil or any other suitable material that partially reflects light projected thereon.

The size of the light-reflective element 73 may be equal or smaller than an area that surrounds by the electrodes 42. For example, the light-reflective element 73 may cover the entire region of the top wall 442. Alternatively, the light-reflective element 73 may cover the central region of the top wall 442 that aligned with the through hole 615 of the probe card 60, and the edge region of the top wall 442 is not covered by the light-reflective element 73.

The light-reflective element 73 may continuously extend on the top wall 442. Alternatively, the light-reflective element 73 has a number of sub-segments scattered on the top wall 442. The light-reflective element 73 may extend parallel to the substrate 61 and perpendicular to an axis A that passes through the through hole 615.

Figure 2:
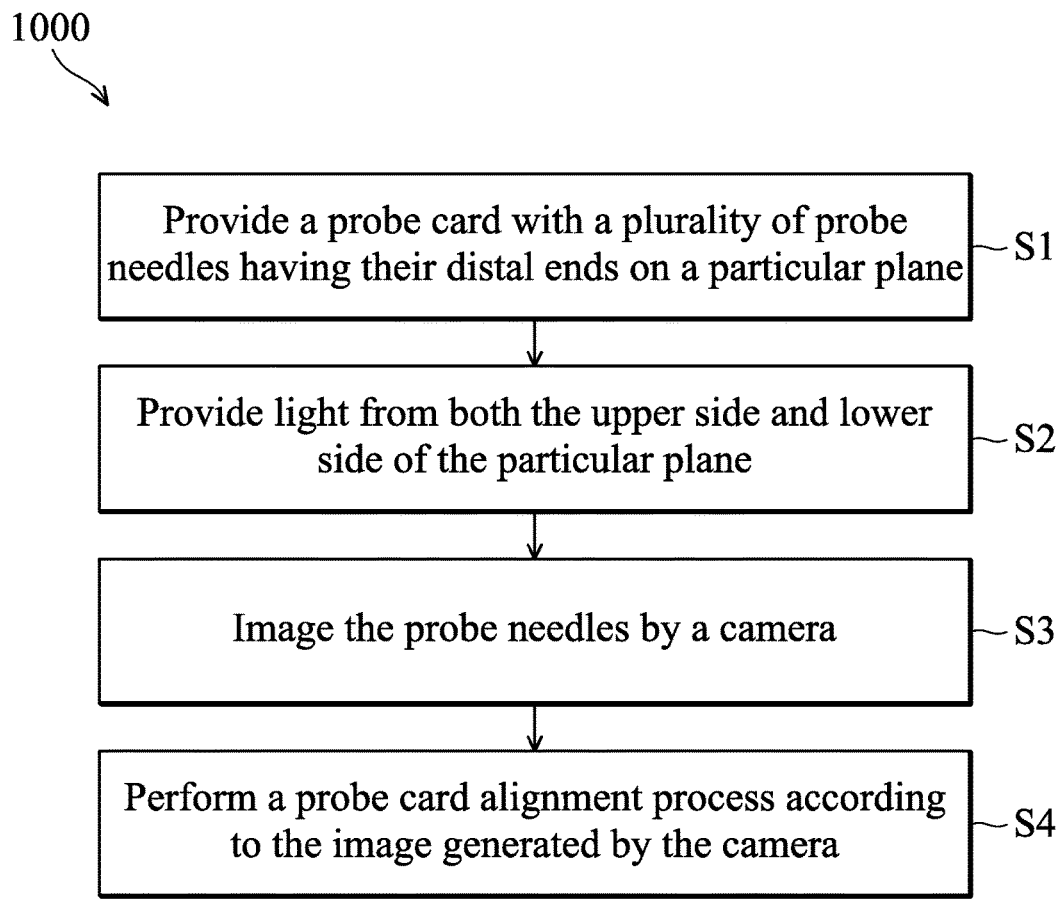
FIG. 2 shows a flow chart illustrating a method for aligning a probe card, in accordance with some embodiments.

FIG. 2 is a flow chart illustrating a method 1000 for processing wafers in an alignment assembly 1, in accordance with some embodiments. For illustration, the flow chart will be described along with the drawings shown in FIG. 1. Some of the described stages can be replaced or eliminated in different embodiments. Additional features can be added to the semiconductor device structure. Some of the features described below can be replaced or eliminated in different embodiments.

The method 1000 begins with operation S1, in which the probe card 60 is positioned into the testing chamber 10. In some embodiments, when a new semiconductor device, i.e. a different semiconductor device than the previously tested semiconductor device, is to be tested upon a test assembly, the hardware of the probe card 60 used for testing the semiconductor device is changed.

To change the probe card 60, the cover 41 of the test head 40 is positioned in an open state in which the testing chamber 10 is not covered by the cover 41, and the probe card 60 is positioned on the holder 16. Afterwards, the cover 41 is positioned in a closed state in which the testing chamber 10 is covered by the cover 41, and the electrodes 42 are electrically connected to the contacts of the probe card 60.

Figure 3:
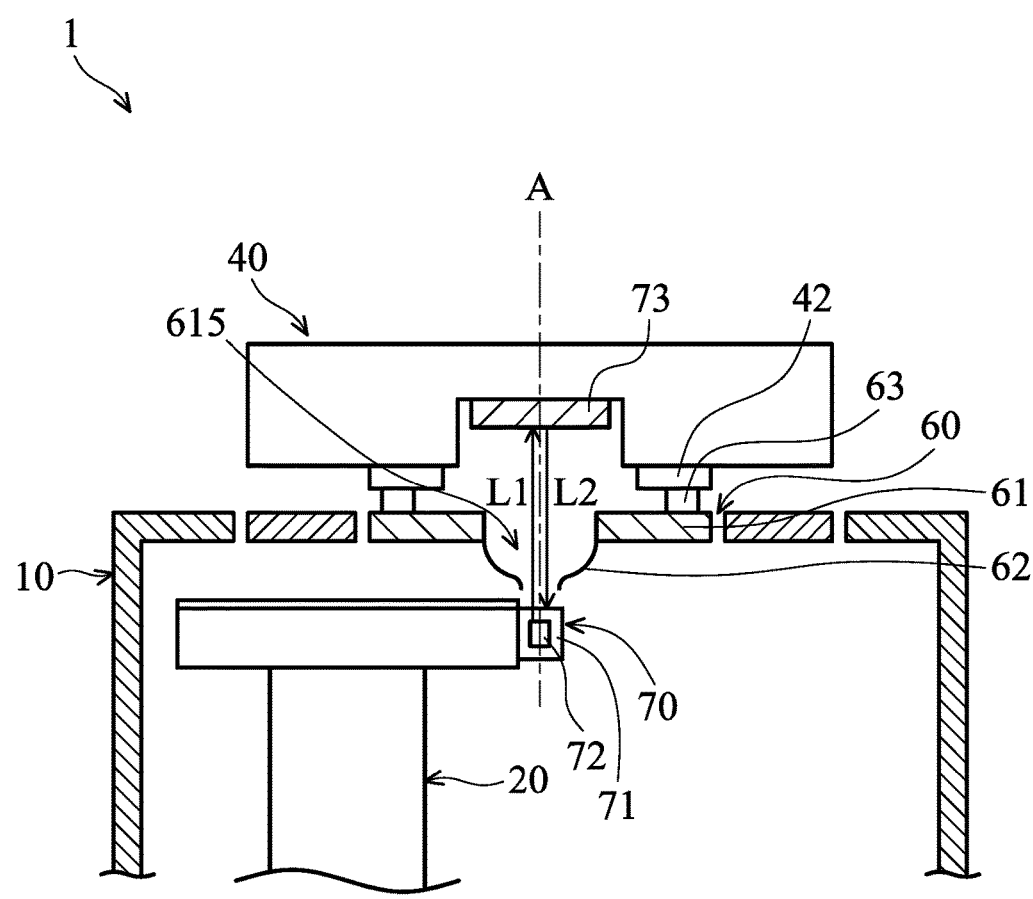
FIG. 3 shows a schematic view of a stage of a method for aligning a probe card, in accordance with some embodiments.

The method 1000 continues with operation S2 in which light is provided by both upper side and lower side of the probe needles 62 to illuminate the probe needles 62. In some embodiments, as shown in FIG. 3, once the probe card 60 is positioned on the holder 16, the wafer stage 20 is moved to a position at which the camera 71 and the light source 72 are positioned below the predetermined region C surrounded by the probe needles 62. Afterwards, the light source 72 is turned on to illuminate the probe needles 62 from the lower side of the probe needles 62.

In cases where the predetermined region C of the substrate 61 having a through hole 615 and a light-reflective element 73 are placed above the substrate 61, at least a portion of the light emitted from the light source 72 passes through the through hole 615 along the axis A and is projected on the light-reflective element 73. After receiving the light, a portion of the light is reflected by the light-reflective element 73 along the axis A and passes through the through hole 615 again to illuminate the probe needles 62 from the upper side of the probe needles 62. It should be understood that, because of the optical characteristics of the light-reflective element 73, the brightness of light from the lower side (i.e., light from the light source 72) is greater than the brightness of light from the upper side (i.e., light from the light-reflective element 73).

The method 1000 continues with operation S3 in which the probe needles 62 are imaged by the camera 71. In some embodiments, the camera 71 images the probe needles 62 by detecting light provided by the backlight unit 73 and the light source 72 simultaneously. In some embodiments, with light provided by the backlight unit 73, the image contrast of the image produced by the camera 71 is increased, and therefore the tapered distal ends 621 of the probe needles 62 are clearly shown in an electrical display.

Figure 4:
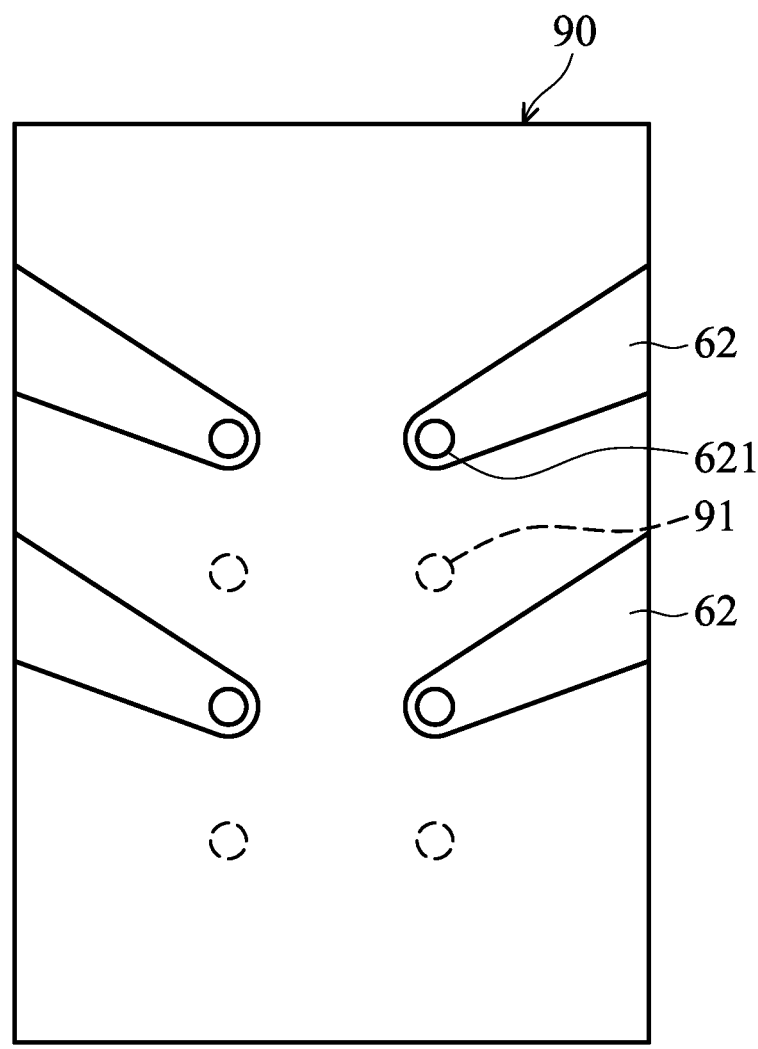
FIG. 4 shows a schematic view of one display screen showing a video image after a probe card is positioned, in accordance with some embodiments.

The method 1000 continues with operation S4 in which a probe card alignment process is performed according to the image generated by the camera 71 to align the probe card 60 relative to the wafer stage 20. In some embodiments, as shown in FIG. 4, the probe card alignment process includes reading the real-time image captured by the camera 71. The probe card alignment process further includes recognizing the position of the distal ends 621 of the probe needles 62 in the real-time image.

In addition, the probe card alignment process includes determining if the distal ends 621 overlap with a template image 90 which shows reference points 91 located in the correct position. If the distal ends 621 do not overlap with the reference points 91, the wafer stage 20 is driven to move to overlap the distal ends 621 with the reference points 91. If the distal ends 621 overlap the reference points 91, the relative position of the probe needles 62 and the wafer stage 20 is determined, and the probe card alignment process is completed. The probe card alignment process may be conducted automatically by an image processor and a controller (not shown in figures) or be conducted by operation personnel.

It is appreciated that the position and the configuration of the backlight unit can be modified and should not be limited to the above embodiments. In the description below, some exemplary possible implementation of the backlight unit will be illustrated.

Figure 5:
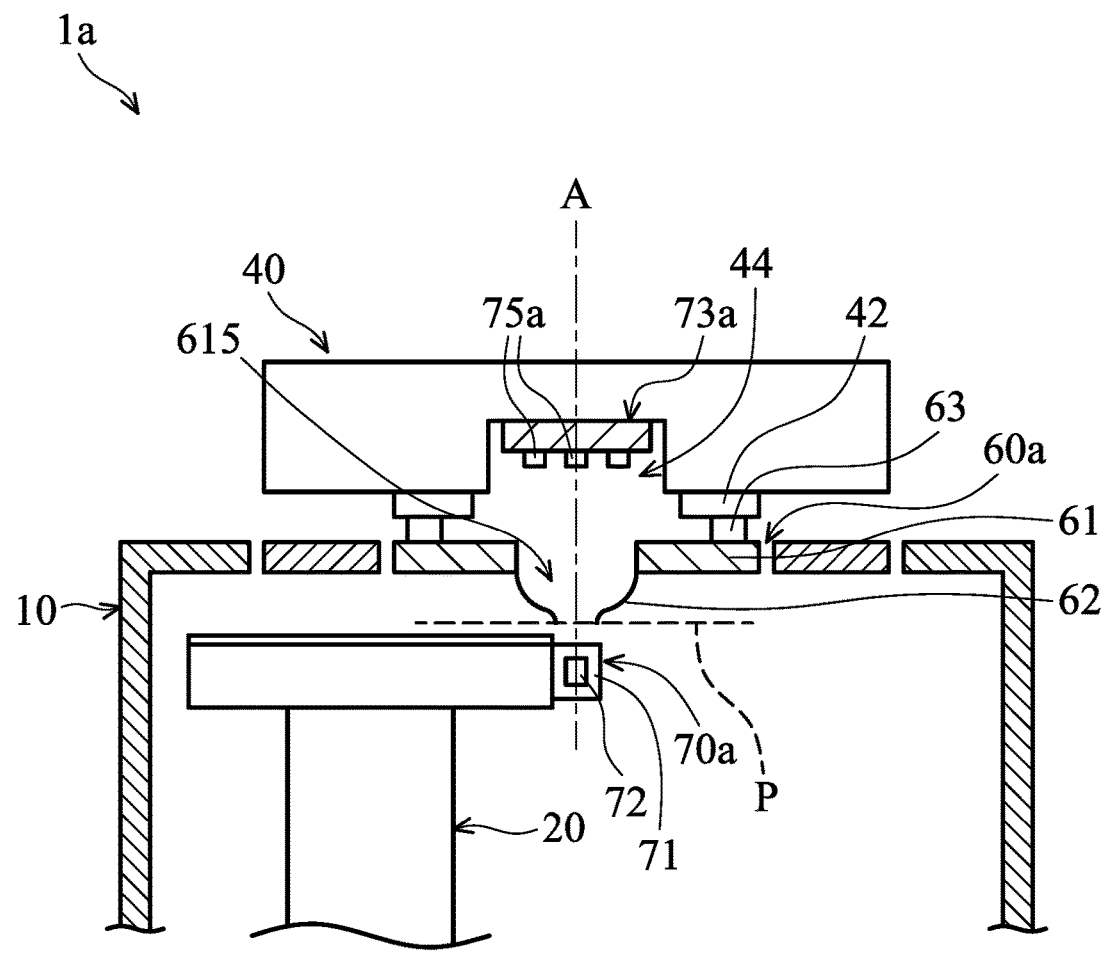
FIG. 5 shows a cross-sectional view of a testing system, in accordance with some embodiments.

FIG. 5 shows a cross-sectional view of partial elements of a testing system 1a, in accordance with some embodiments. In the embodiments shown in FIG. 5, elements similar to those shown in FIG. 1 are provided with the same reference numbers, and the features thereof are not reiterated in the interests of brevity. In some embodiments, the backlight unit 73a includes a light source 75a, such as an LED (light-emitting diode), to emit light vertically downward through the through hole 615. The backlight unit 73a is positioned in the recess 44 and positioned on the axis A that passes through the through hole 615 of the probe card 60. However, it should be appreciated that many variations and modifications can be made to embodiments of the disclosure. The backlight unit 73a may be positioned to be laterally offset from the axis A.

In some embodiments, by the use of the testing system 1a in the operation S2 of method 1000, the light source 72 and the backlight units 73a are switched on at the same time. The probe needles 62 are illuminated by the light from the light source 72 and the backlight units 73a simultaneously. The brightness of light from the lower side (i.e., light from the light source 72) may be controlled to be greater than the brightness of light from the backlight unit 73a thereby the image quality is improved.

Figure 6:
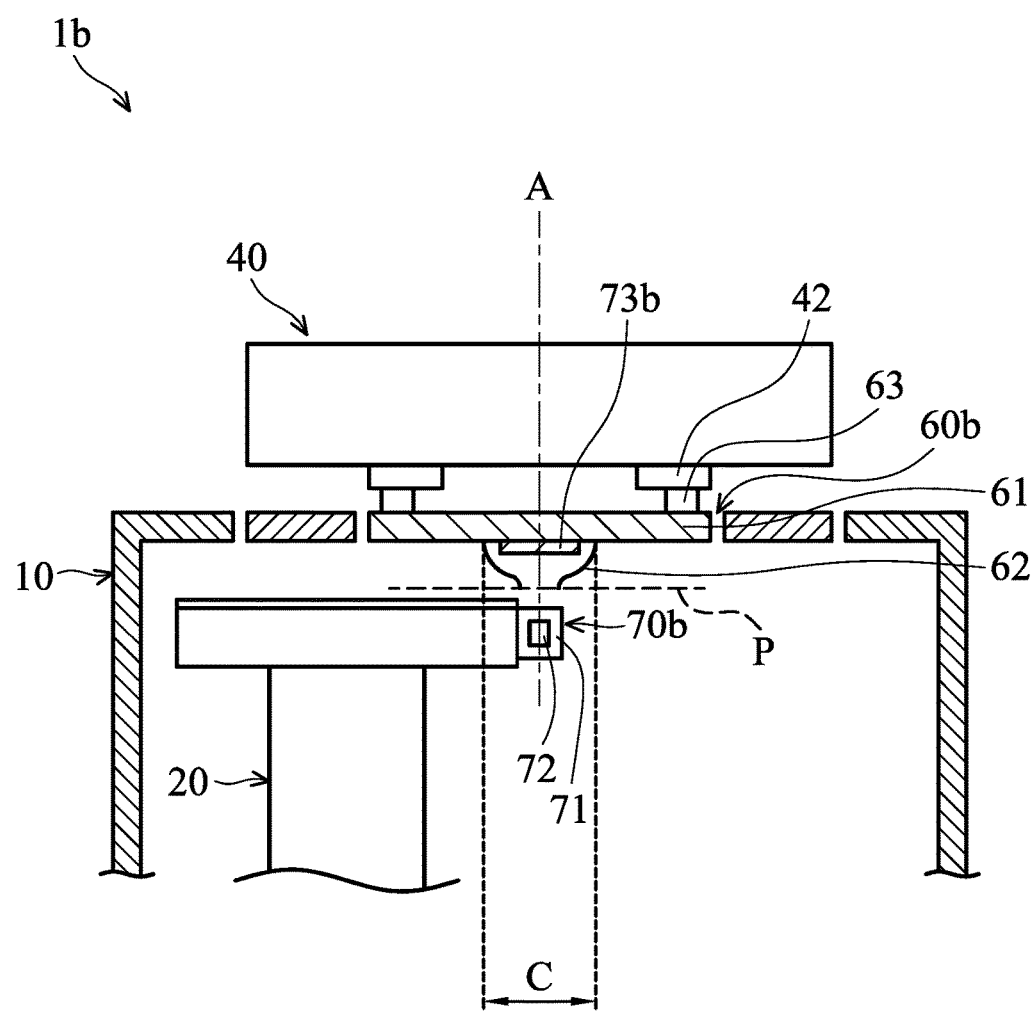
FIG. 6 shows a cross-sectional view of a testing system, in accordance with some embodiments.

FIG. 6 shows a cross-sectional view of partial elements of a testing system 1b, in accordance with some embodiments. In the embodiments shown in FIG. 6, elements similar to those shown in FIG. 1 are provided with the same reference numbers, and the features thereof are not reiterated in the interests of brevity. In some embodiments, the through hole of the probe card 60b is omitted. A backlight unit 73b is directly positioned on the probe card 60b. The backlight unit 73b may be a light-reflective element to partially reflect light project thereon. Alternatively, the backlight unit 73b may be an active light source, such as an LED (light-emitting diode), to emit light vertically downward through the through hole 615.

In some embodiments, the backlight unit 73b is positioned between the probe needles 62 and the substrate 61. For example, the backlight unit 73b is directly attached on the lower surface 613 of the substrate 61 and positioned within the predetermined region C that is surrounded by the probe needles 62. To image the probe needles 62, the camera 71, the light source 72 and the backlight unit 73b of the alignment assembly 70b are arranged substantially along the axis A.

Figure 7:
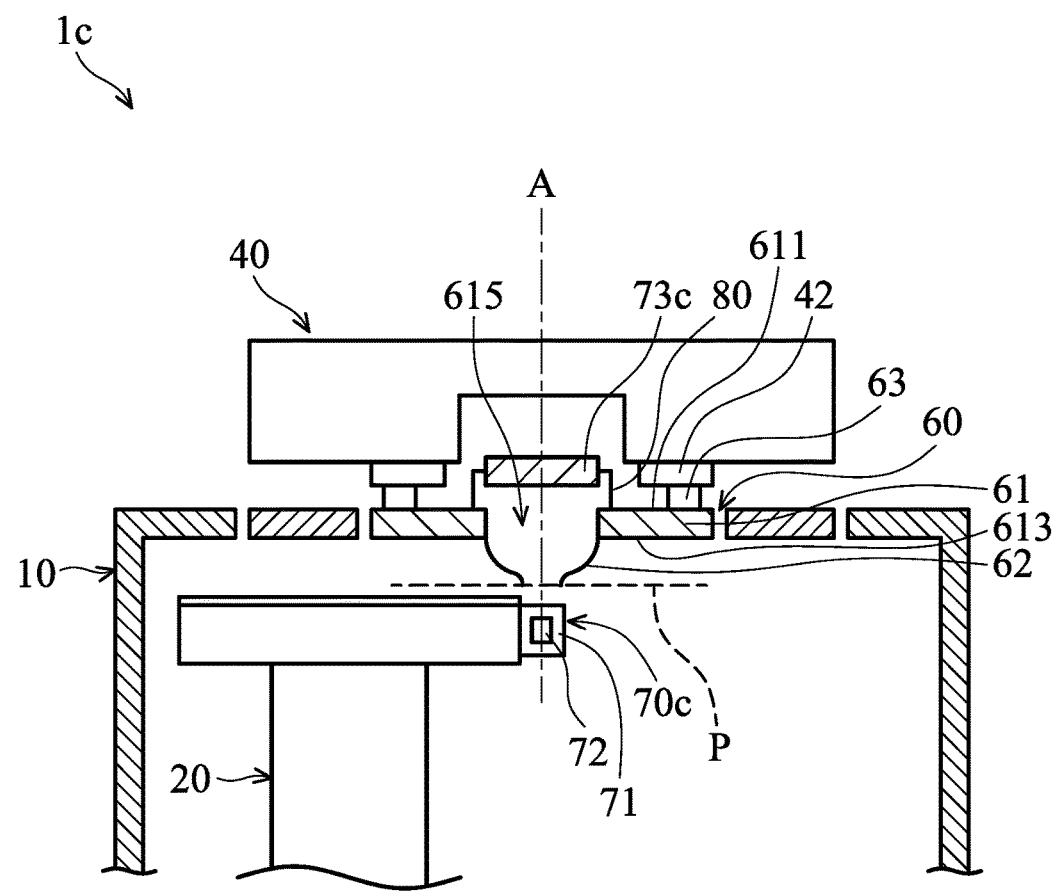
FIG. 7 shows a cross-sectional view of a testing system, in accordance with some embodiments.

FIG. 7 shows a cross-sectional view of partial elements of a testing system 1c, in accordance with some embodiments. In the embodiments shown in FIG. 7, elements similar to those shown in FIG. 1 are provided with the same reference numbers, and the features thereof are not reiterated in the interests of brevity. In some embodiments, the testing system 1c further includes a bracket 80c arranged above the through hole 615 of the probe card 60. The bracket 80c is positioned on the upper surface 611 of the substrate 61.

A backlight unit 73c is positioned on the bracket 80c. The backlight unit 73c may be a light-reflective element to partially reflect light project thereon. Alternatively, the backlight unit 73c may be an active light source, such as an LED (light-emitting diode), to emit light vertically downward through the through hole 615. To image the probe needles 62, the camera 71, the light source 72 and the backlight unit 73c of the alignment assembly 70c are arranged substantially along the axis A.

Embodiments of a method for aligning a probe card before a wafer acceptance test is conducted are provided. The alignment of the probe card is performed by analyzing images of probe needles of the probe card. Since the probe needles are illuminated by light from both upper side and lower side, a contrast image of the probe needles can be created. Therefore, the alignment process can be performed in a shorter time than the conventional testing system with no backlight unit for providing light from the backside of the probe needles. In addition, since the alignment process can be completed efficiently and accurately, scratches on the semiconductor devices due to abnormal contact created between the probe needles and the semiconductor devices can be prevented, and the product yield is increased. Moreover, since the positions of the tips of the probe needles can be perceived easily, no expensive optical parts are required. Accordingly, the manufacturing cost is reduced.

In accordance with some embodiments a testing system for testing semiconductor devices is provided. The testing system includes a probe card. The probe card includes a substrate and a number of probe needles positioned on the substrate. The distal ends of the probe needles are located on a reference plane that is distant from the substrate. The testing system also includes a test head. The test head is positioned over the probe card and includes a number of electrodes electrically connected to the probe needles. The testing system further includes a backlight unit and a light source. The backlight unit is positioned above the reference plane and oriented to illuminate the probe needles. The light source is positioned below the reference plane and oriented to illuminate the probe needles. In addition, the testing system includes a camera. The camera is positioned below the reference plane for imaging the probe needles by detecting light from the backlight unit and the light source.

In accordance with some embodiments a testing system for testing semiconductor devices is provided. The testing system includes a probe card. The probe card includes a substrate and a plurality of probe needles surrounding a predetermined region of the substrate. The testing system also includes a test head. The test head is positioned over the probe card and includes a number of electrodes electrically connected to the probe needles. The testing system further includes an alignment assembly. The alignment assembly includes a light source, a backlight unit, and a camera arranged substantially along an axis that passes through the predetermined region. The light source and the backlight unit are positioned at two sides of the probe needles. The camera images the probe needles by detecting light provided by the backlight unit and the light source.

In accordance with some embodiments a method for probe card alignment is provided. The method includes providing a probe card with a plurality of probe needles having their distal ends on a reference plane. The method further includes providing a light from both the upper side and lower side of the reference plane. The method also includes using a camera to image the probe needles. In addition, the method includes performing a probe card alignment process according to the image generated by the camera.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A testing system for testing semiconductor devices, comprising:
    a probe card comprising a substrate and a plurality of probe needles positioned on the substrate and with their distal ends located on a reference plane that is distant from the substrate;
    a test head positioned over the probe card and comprising a plurality of electrodes electrically connected to the probe needles;
    a backlight unit positioned above the reference plane and oriented to illuminate the probe needles;
    a light source positioned below the reference plane and oriented to illuminate the probe needles; and
    a camera positioned below the reference plane for imaging the probe needles by detecting light from the backlight unit and the light source,
    wherein the test head further comprises a cover on which the electrodes are positioned, and a recess is formed on the cover and is surrounded by the electrodes, wherein the backlight unit is positioned in the recess.

2. The testing system as claimed in claim 1, wherein the backlight unit comprises a light-reflective element, and the light source is oriented to illuminate the light-reflective element so as to enable the light-reflective element to reflect light from the light source to illuminate the probe needles.

3. The testing system as claimed in claim 2, wherein the light-reflective element comprises a thin plastic film.

4. The testing system as claimed in claim 1, wherein the substrate of the probe card has a through hole arranged relative to the probe needles, and the backlight unit and the light source are positioned at two opposite sides of the through hole.

5. The testing system as claimed in claim 1, wherein the brightness of light from the light source is greater than the brightness of light from the backlight unit.

6. The testing system as claimed in claim 1, wherein the light source and the backlight unit are oriented to provide light in a direction that is vertical to the substrate.

7. A testing system for testing semiconductor devices, comprising:
    a probe card comprising a substrate and a plurality of probe needles surrounding a predetermined region of the substrate;
    a test head positioned over the probe card and comprising a plurality of electrodes electrically connected to the probe needles; and
    an alignment assembly comprising a light source, a backlight unit, and a camera arranged substantially along an axis that passes through the predetermined region, wherein the light source and the backlight unit are positioned at two sides of the probe needles, and the camera images the probe needles by detecting light provided by the backlight unit and the light source,
    wherein the test head further comprises a cover on which the electrodes are positioned, and a recess is formed on the cover and is surrounded by the electrodes, wherein the backlight unit is positioned in the recess.

8. The testing system as claimed in claim 7, wherein the backlight unit comprises a light-reflective element, and the light source is oriented to illuminate the light-reflective element so as to enable the light-reflective element to reflect light from the light source to illuminate the probe needles.

9. The alignment assembly as claimed in claim 8, wherein the light-reflective element comprises a thin plastic film.

10. The testing system as claimed in claim 7, wherein the substrate of the probe card has a through hole located at the predetermined region, and the backlight unit and the light source are positioned at two opposite sides of the through hole.

11. The testing system as claimed in claim 7, wherein the brightness of light from the light source is greater than the brightness of light from the backlight unit.

12. The testing system as claimed in claim 7, wherein the light source and the backlight unit are oriented to provide light in a direction that is perpendicular to the substrate.

13. An alignment method for probe card in testing system alignment, comprising:
    providing a probe card with a plurality of probe needles having their distal ends on a reference plane;
    providing a light from both the upper side and lower side of the reference plane;
    using a camera to image the probe needles; and
    performing a probe card alignment process according to the image generated by the camera; and
    testing semiconductor devices using the aligned probe card being electrically connected to a test head,
    wherein the test head comprises a cover with a recess formed thereon, and a backlight unit for providing the light from the upper side of the reference plane is positioned in the recess.

14. The method as claimed in claim 13, wherein the backlight unit is a light-reflective element which reflects light from a light source that is positioned at the lower side of the reference plane.

15. The method as claimed in claim 14, wherein the light-reflective element comprises a thin plastic film.

16. The method as claimed in claim 13, wherein the brightness of light from the lower side is greater than the brightness of light from the upper side.

17. The testing system as claimed in claim 1, further comprising a wafer stage positioned below the reference plane to hold the semiconductor devices, wherein the light source and the camera are disposed on the wafer stage.

18. The testing system as claimed in claim 8, wherein a size of the light-reflective element is equal or smaller than the predetermined region.

19. The testing system as claimed in claim 4, wherein the backlight unit that is positioned in the recess is positioned on an axis that passes through the through hole.

20. The testing system as claimed in claim 17, wherein the light source and the camera are movable together with the wafer stage relative to the probe card.

* * * * *